United States Patent
Tian et al.

(10) Patent No.: US 11,955,324 B2
(45) Date of Patent: Apr. 9, 2024

(54) HIGH POWER PULSE SYSTEMS FOR SURFACE PROCESSING

(71) Applicant: JEFFERSON SCIENCE ASSOCIATES, LLC, Newport News, VA (US)

(72) Inventors: Hui Tian, Yorktown, VA (US); John C. Musson, Newport News, VA (US); Matthew Creed Burton, Hanover, MD (US); Anne-Marie Valente-Feliciano, Newport News, VA (US); Larry Phillips, Newport News, VA (US)

(73) Assignee: JEFFERSON SCIENCE ASSOCIATES, LLC, Newport News, VA (US)

( * ) Notice: Subject to any disclaimer, the term of this patent is extended or adjusted under 35 U.S.C. 154(b) by 315 days.

(21) Appl. No.: 17/495,702

(22) Filed: Oct. 6, 2021

(65) Prior Publication Data
US 2022/0199381 A1    Jun. 23, 2022

Related U.S. Application Data

(60) Provisional application No. 63/062,496, filed on Aug. 7, 2020.

(51) Int. Cl.
*H01J 37/34* (2006.01)
*C23C 14/34* (2006.01)
(Continued)

(52) U.S. Cl.
CPC ...... *H01J 37/3467* (2013.01); *C23C 14/3485* (2013.01); *C23C 14/35* (2013.01);
(Continued)

(58) Field of Classification Search
CPC .............. H01J 37/3405; H01J 37/3467; H01J 37/3488; H01J 2237/332; C23C 14/35; C23C 14/3485; H02H 9/02
See application file for complete search history.

(56) References Cited

U.S. PATENT DOCUMENTS

5,889,391 A * 3/1999 Coleman ............... H02M 3/158
323/285
2003/0058160 A1* 3/2003 Kitabatake .............. G01S 7/282
342/204
(Continued)

*Primary Examiner* — Tung X Le (57) ABSTRACT

A high-power pulsed surface processing system includes insulated-gate bipolar transistors (IGBT) to replicate desirable pulse structures with high precision, at low cost, and with high reliability within a single system. The pulsed surface processing system includes a power supply, an anode and a cathode, a dual gate driver supplying power to one or more IGBT gates, and one or more capacitor banks. Pulse formation software controls the timing and duration of electrical pulses to the electrodes. A freewheeling diode protects the system from an abrupt reduction of current in the circuit. The high-power pulsed surface processing system may be used to control versatile and complex pulse structures while with precise control of instantaneous pulse powers, pulse timing, and process control. The inclusion of dual gate drivers also offers the ability for multiple pulsers to be created and "slaved" together for a wide variety of custom processes.

20 Claims, 10 Drawing Sheets

(51) Int. Cl.
*C23C 14/35* (2006.01)
*H02H 9/02* (2006.01)

(52) U.S. Cl.
CPC ...... *H01J 37/3405* (2013.01); *H01J 37/3488* (2013.01); *H02H 9/02* (2013.01); *H01J 2237/332* (2013.01)

(56) References Cited

U.S. PATENT DOCUMENTS

2006/0278518 A1* 12/2006 Kouznetsov ........ H01J 37/3444
　　　　　　　　　　　　　　　　　　　204/192.1
2008/0135401 A1*　6/2008 Kadlec ................ C23C 14/3485
　　　　　　　　　　　　　　　　　　　204/192.12

* cited by examiner

HIGH POWER PULSE SYSTEMS FOR SURFACE PROCESSING

This application claims the benefit of Provisional U.S. Patent Application Ser. No. 63/062,496 filed Aug. 7, 2020, the contents of which are incorporated herein by reference in their entirety.

The United States Government may have certain rights to this invention under Management and Operating Contract No. DE-AC05-06OR23177 from the Department of Energy.

FIELD OF THE INVENTION

The present invention relates to the treatment of surfaces with electrical energy in order to alter the surface characteristics of the surface.

BACKGROUND OF THE INVENTION

Currently, pulsed high power electrical applications and processes, such as thin film deposition, chemical processing, ion stitching, implantation, etching & doping and many other techniques require highly specialized, inflexible and expensive equipment that is only available from a very limited number of suppliers. The system presented uses a unique system of addressing these issues by offering customizability, flexibility, high precision and affordability by leveraging newer semiconductor technologies capable of creating high power pulses with any combination of voltage, current, pulse configuration and specific timing structures.

OBJECT OF THE INVENTION

It is an object of the invention to provide an improved high-power pulse system for processing the surface of materials.

It is a further object of the invention to provide greater customizability, flexibility, higher precision, and affordability of high-power pulse processes by leveraging advanced semiconductor technologies capable of creating high power pulses with any combination of voltage, current, pulse configuration and specific timing structures Another object of the invention is to provide a high-power pulse system that does not require highly specialized, inflexible, and expensive equipment that is only available from a very limited number of suppliers.

Another object of the invention is to provide a high-power pulse system that can easily be combined with other methods to improve surface processing methods.

These and other objects and advantages of the present invention will be understood by reading the following description along with reference to the drawings.

SUMMARY OF THE INVENTION

Pulsed surface processing equipment has evolved from simple on/off systems to highly specialized time structures requiring flexible, robust, specialized and expensive machines. This invention seeks to address these concerns by employing Insulated-Gate Bipolar Transistor (IGBT) technology to replicate all pulse structures with high precision, high reliability and at low cost while within a single system. While originally intended for deposition processes such as pulsed DC magnetron sputtering and High-Power Impulse Magnetron Sputtering (HIPIMS), the system of the current invention can be used for a variety of other pulsed electrical applications, such as plasma generation, modulated pulse power magnetron sputtering (MMPMS), bi-polar pulsing for electrochemistry, intricate bias voltage controls, and manipulation of ion species for stitching and etching. Overall, the high-power pulse system of the present invention is highly versatile and can meet the operational requirements for a multitude of research and industrial applications.

BRIEF DESCRIPTION OF THE SEVERAL VIEWS OF THE DRAWING(S)

Reference is made herein to the accompanying drawings, which are not necessarily drawn to scale, and wherein.

DETAILED DESCRIPTION

The high-power pulse system of the present invention leverages the unique implementation of solid state switchers comprised of high voltage IGBTs with associated gate drivers. Overall, this allows access to versatile and complex pulse structures used in both unipolar and bipolar pulsing modes while still allowing precise control of instantaneous pulse powers, timing, as well as process control. The inclusion of gate drivers also offers the ability for multiple pulsers to be created and "slaved" together for a wide variety of custom processes. The pulser developed here was intended for deposition techniques such as HIPIMS, modulated pulsed power magnetron sputtering (MPPMS), RF hybrid deposition, and bipolar pulsing for electrochemistry. This high-power pulse system is also being used for pulsed electrical bias as a standalone, slave to master gate, and slave to an independent time reference for in-situ ion selection and manipulation.

Figure 1:
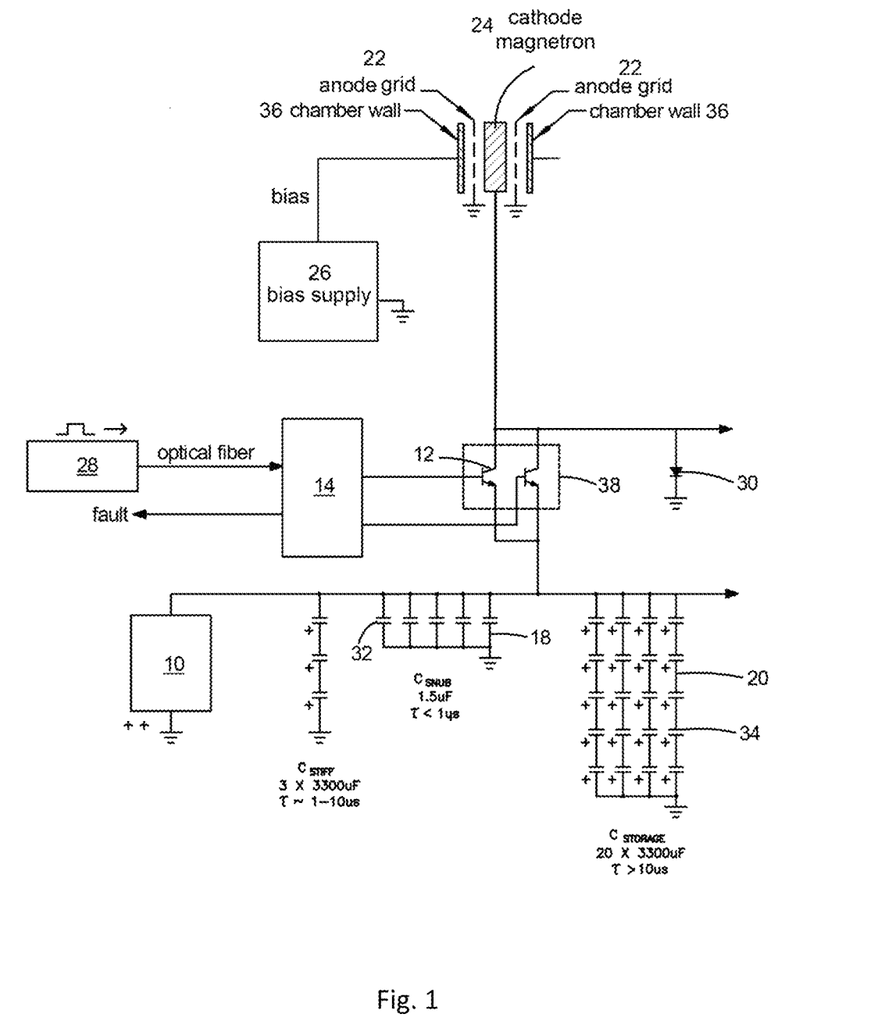
FIG. 1 is a diagram of a high-power impulse magnetron sputtering (HIPIMS) system according to the invention.

With reference to FIG. 1, the HIPIMS pulsed surface processing system includes a DC power supply 10, a solid state switcher 38 comprised of one or more of IGBT gates 12 in parallel, a dual gate driver 14 supplying power to the IGBT gates 12, one or more capacitor banks 18 and 20, multiple electrically conducting surfaces, shown here as an anode 22 and a cathode in a magnetron configuration, 24 to produce an arc for processing the surface of a material. A bias voltage 26 supplies power to the surface of interest 36 and the pulse formation software 28 controls the timing and duration of electrical pulses to the electrodes. A freewheeling diode 30 protects the system from pulse reflections originating from rapid changes in electrical load. The one or more capacitor banks preferably include a first capacitor bank 18 including one or more high frequency, fast response capacitors 32 and a second capacitor bank 20 including one or more high energy density capacitors 34. The one or more capacitors in the first capacitor bank are preferably 1.5 µF or less and the one or more capacitors in the second capacitor bank are preferably 3300 µF.

A collection 18 of high frequency fast response capacitors 32 mounted close to the switch provide low impedance, fast response to load change in addition to quick snubbing to prevent transient pulse phenomena. High energy density capacitors 34 supply the required electrical energy through the entirety of the pulse.

The HiPIMS pulsed surface processing system further includes a magnetron 24 to produce magnetron sputtering and confine a plasma to the surface of an object being treated. The specific HiPIMS system referenced includes a 20 kW power supply to drive the magnetron 36. The pulses of the pulsed surface processing system preferably include a pulse frequency of DC to 1 MHz and an adjustable pulse duration of 1 µs to 100 ms. The pulses preferably include a maximum current of 2000 amps with the current regulated within 50 amps of target. The pulses preferably include a maximum voltage of 2000 volts with the voltage regulated within 2 volts of target.

The deliverable pulse power is scaled horizontally by expanding the system with more IGBTs, larger capacitor banks and a bigger DC power supply. This flexibility and scalability is crucial when implementing this invention for diverse applications.

The technical specifications for a HIPIMS Pulser according to the invention are given in Table 1 below.

TABLE 1

HIPIMS Pulser Technical Specifications

| | |
|---|---|
| Power Supply | The HIPIMS provides at least 20 kW power supply to supply necessary current in pulsed mode to drive high power impulsive magnetron sputtering. |
| Pulse Frequency | The pulse frequency is adjustable from DC to 1 MHz for versatile operation. |
| Pulse Duration | Pulse duration is adjustable from 1 µs to 100 ms. |
| Current Maximum | 2,000 A |
| Current Regulation | Current regulation is as fine as 50 A |
| Voltage Maximum | 2,000 V |
| Voltage Regulation | Voltage regulation is as fine as 2 V |

This invention can be used to tune sequentially and without interruption the structure of a film for superconducting RF cavities at different geometries and frequencies for improved performance.

The present invention can be combined as a pulsed bias voltage source with other energetic condensation methods such as, but not limited to, deposition by electron cyclotron resonance post-ionization to further tune the ion energy during film seeding, nucleation and growth by creating and annihilating defects.

The present invention can be used to deposit high quality fully relaxed superconducting films, Nb films with RRR approaching 1000, NbTiN films with tuned coherence length and nominal $T_c$, other B1 compounds, A15 compounds such as, but not limited to, $Nb_3Sn$, $Nb_3Al$, $Mo_3Re$, $V_3Si$, dielectric films of $Al_2O_3$, AlN, ZrN, HfN, and other ceramics The present invention is also used to produce metamaterials and structures comprised of a combination of superconductor and insulator nanometric layers adequate for superconducting RF accelerator, detector, and sensing applications.

An embodiment combines the present invention with an ultra high vacuum system including a rotating carrousel of cylindrical magnetrons sleeved with targets made of the materials of interest, electron cyclotron resonance (ECR) sources and other deposition techniques for in-situ etching, graded interfacing, ion stitching and intermixing leading to continuously crystalline interfaces, and deposition with different methods such as, but not limited to, DCMS, HiPIMS, MPPMS, reactive DCMS, reactive HiPIMS, enhanced ECR of monolayer and multilayered structures on in-situ etched and plasma cleaned Nb, copper and other substrates for superconducting RF cavities, and other 3D structures, quantum superconducting electronics, qubits, and other 2D structures.

The present invention in HiPIMS configuration may be used to modify or engineer the final RF surface of a bulk or film Nb cavity with ion implantation and modification of the surface oxide and material within the penetration depth to tune the final residual resistance.

An embodiment of the present invention is used for environmentally friendly surface treatment, processing such as bi-polar pulsed electropolishing for final superconducting RF surface preparation which otherwise typically involves HF and other acids, substrate preparation for subsequent deposition, and surface modification as precisely controlling the removal rate, total thickness removed, the surface morphology, and chemistry. In this embodiment, the pulser is configured in a low voltage, high current, bipolar mode allowing positive and negative pulses of varying voltage and current to be orchestrated to accomplish the electrochemical process.

Figure 2:
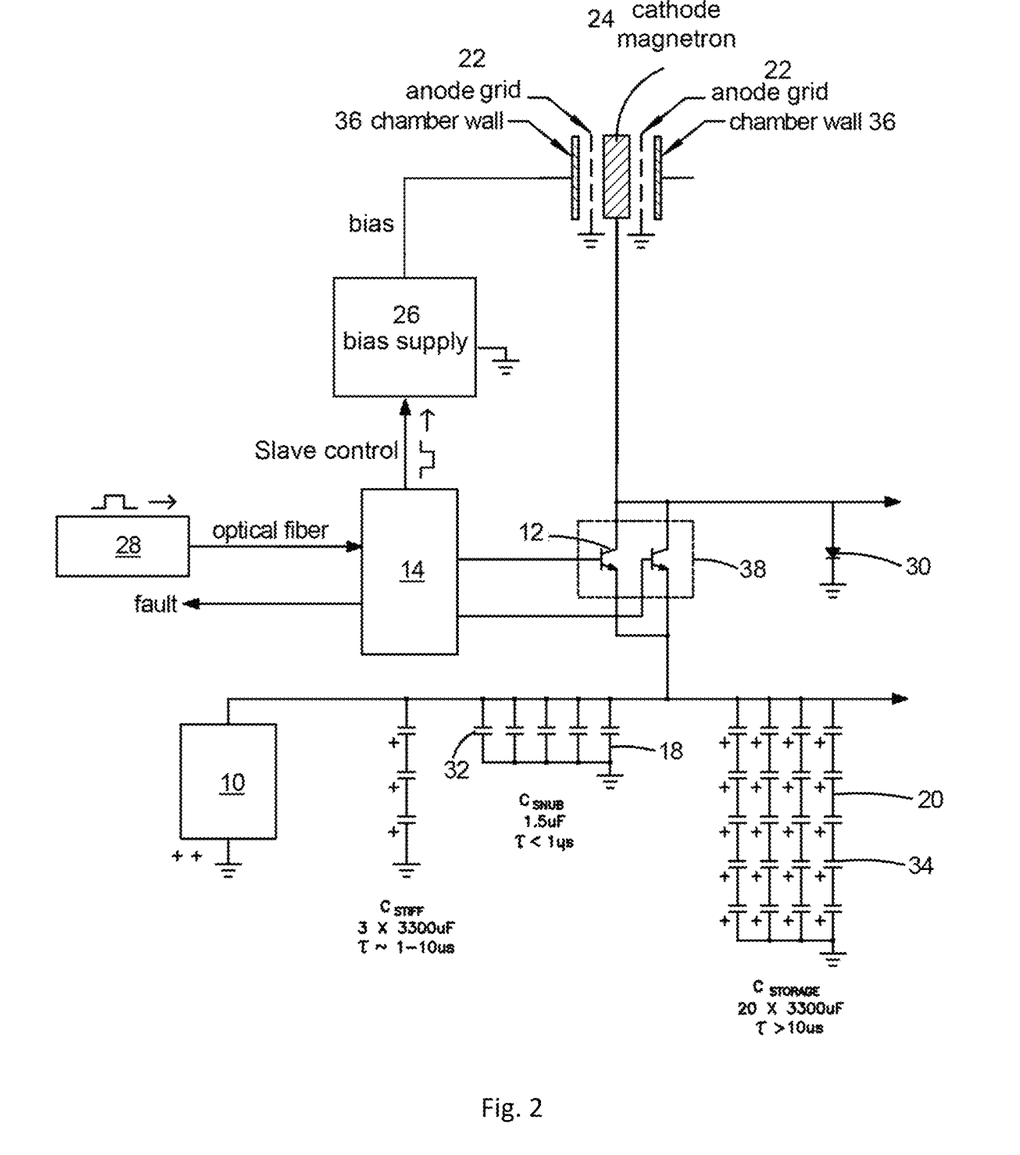
FIG. 2 is a diagram of a high-power impulse magnetron sputtering (HIPIMS) system according to the invention with a slaved bias voltage consisting of an embodiment of the invention.
Figure 3:
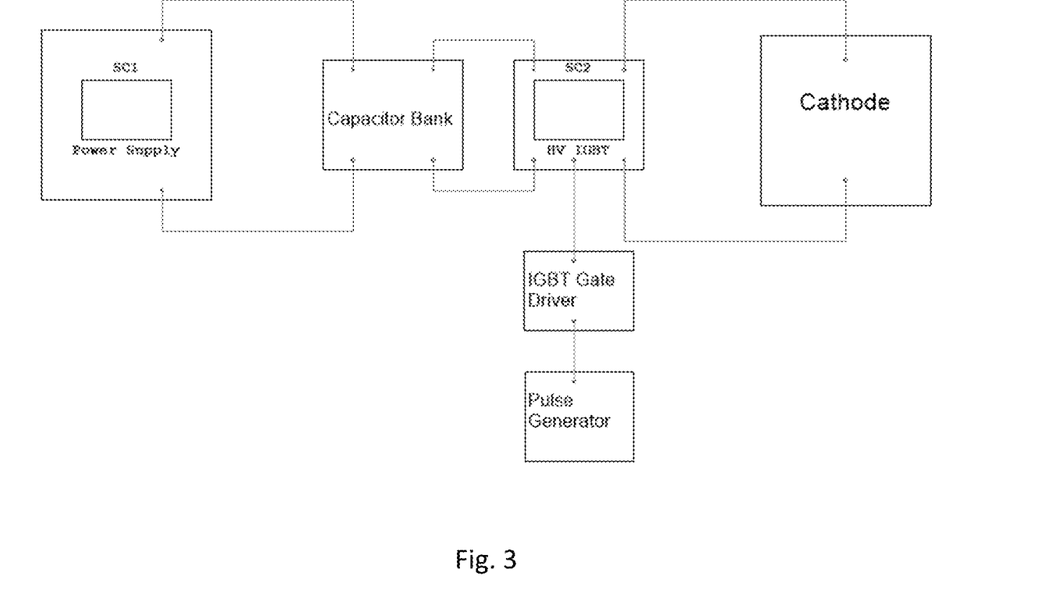
FIG. 3 is a diagram of a second embodiment of a high-power impulse magnetron sputtering (HIPIMS) coating system according to the invention.
Figure 4:
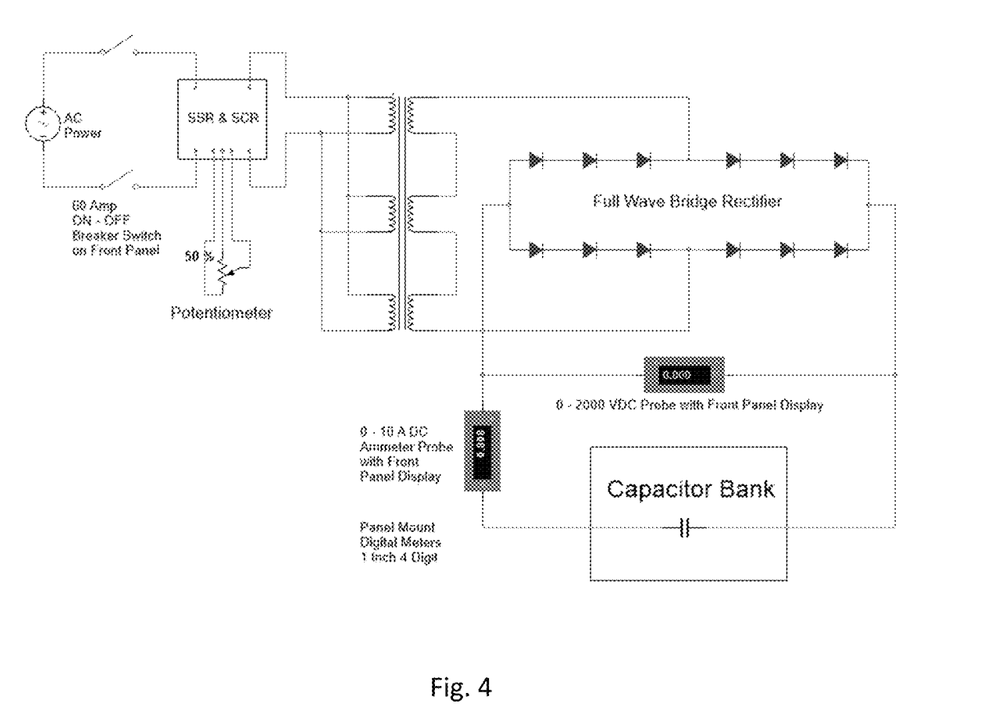
FIG. 4 is a diagram of a power supply setup for powering a HIPIMS deposition system according to the invention.
Figure 5:
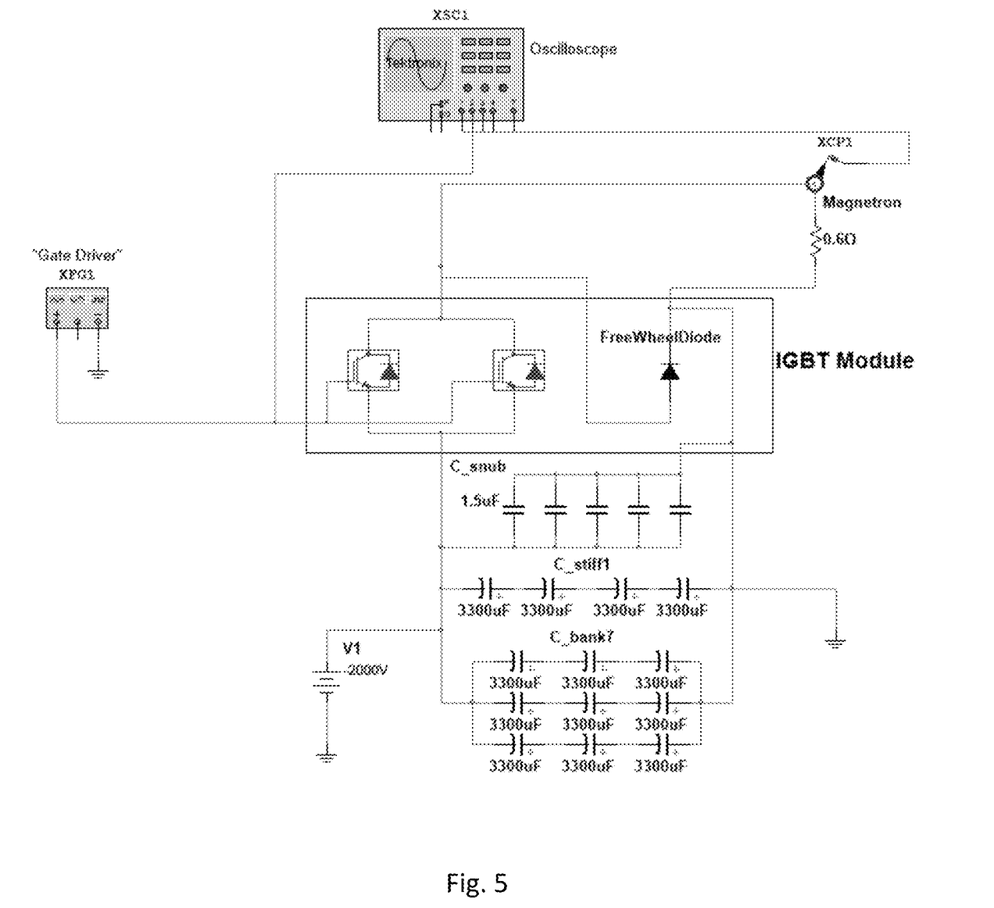
FIG. 5 is a schematic of the pulser depicting a potential layout of the IGBT modules, the gate driver, and capacitor banks.

The configuration of the IGBTs in a solid-state switcher varies depending on the final application. With reference to FIG. 1 representing an embodiment for the HiPIMS application and reference to FIG. 2 representing an embodiment for the HiPIMS application in master/slave configuration, the solid-state switcher 38 is composed of IGBTs 12 in parallel. With reference to FIG. 2, the pulse bias voltage source 26 for supplying power to components of interest 36 can be an embodiment of the present invention and is slaved to the master pulse.

Figure 6:
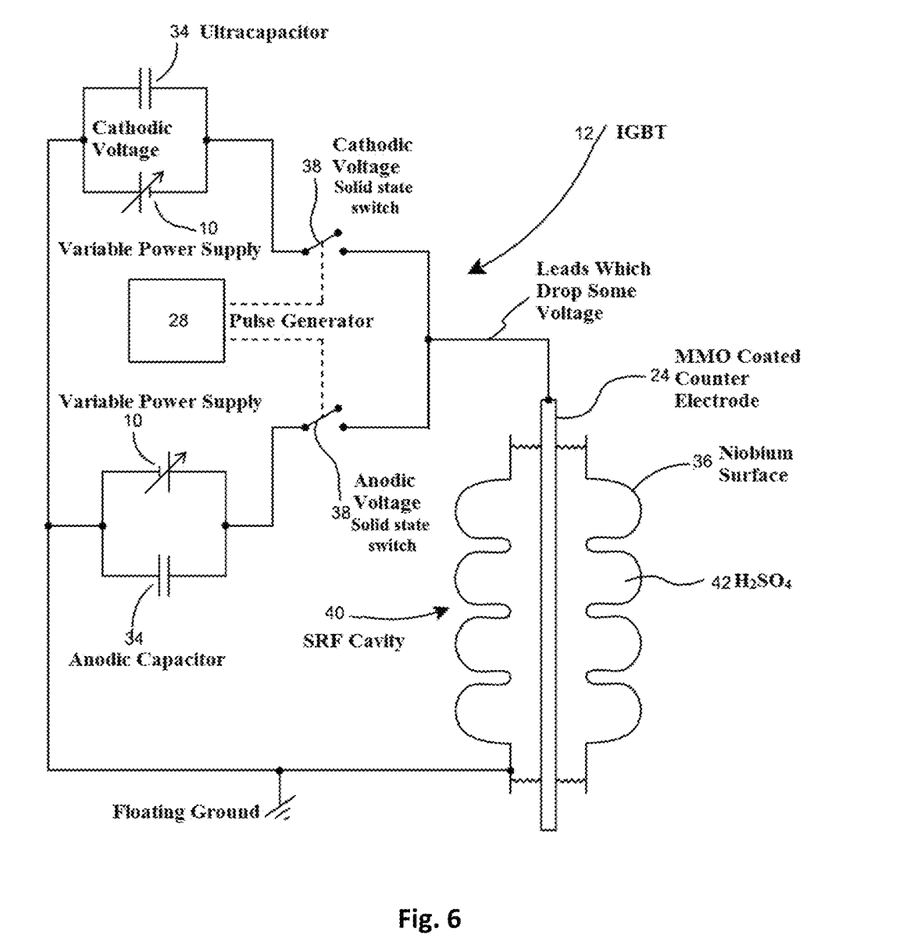
FIG. 6 is a diagram of an embodiment of bi-polar pulse electropolishing.
Figure 7:
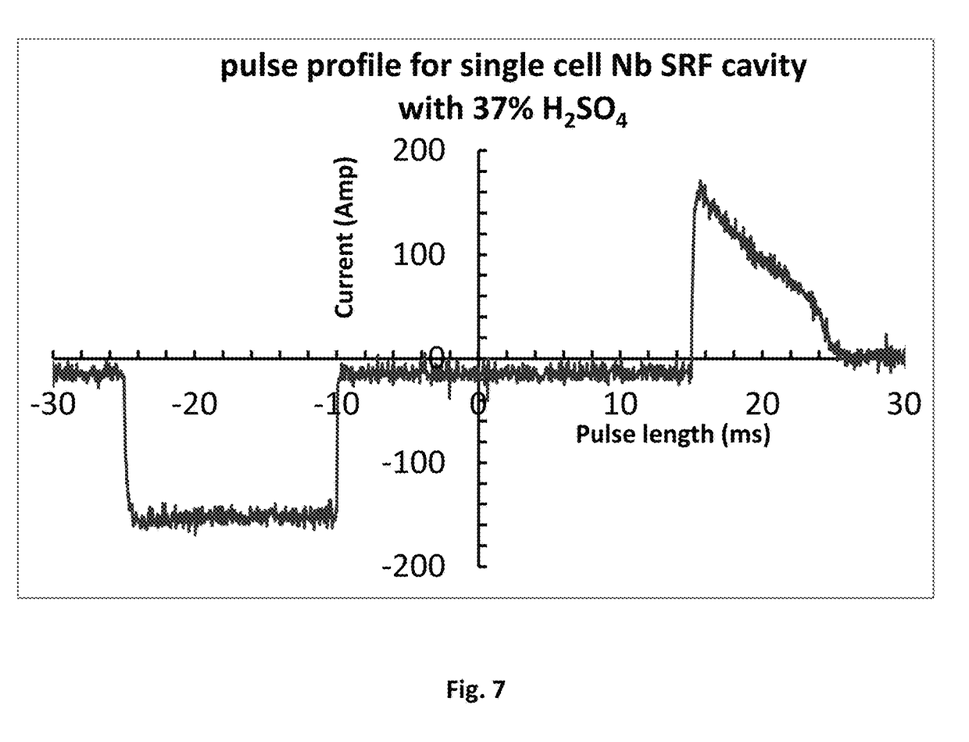
FIG. 7 is the pulse profile of the bi-polar electro-polishing embodiment for Nb SRF single cell
Figure 8:
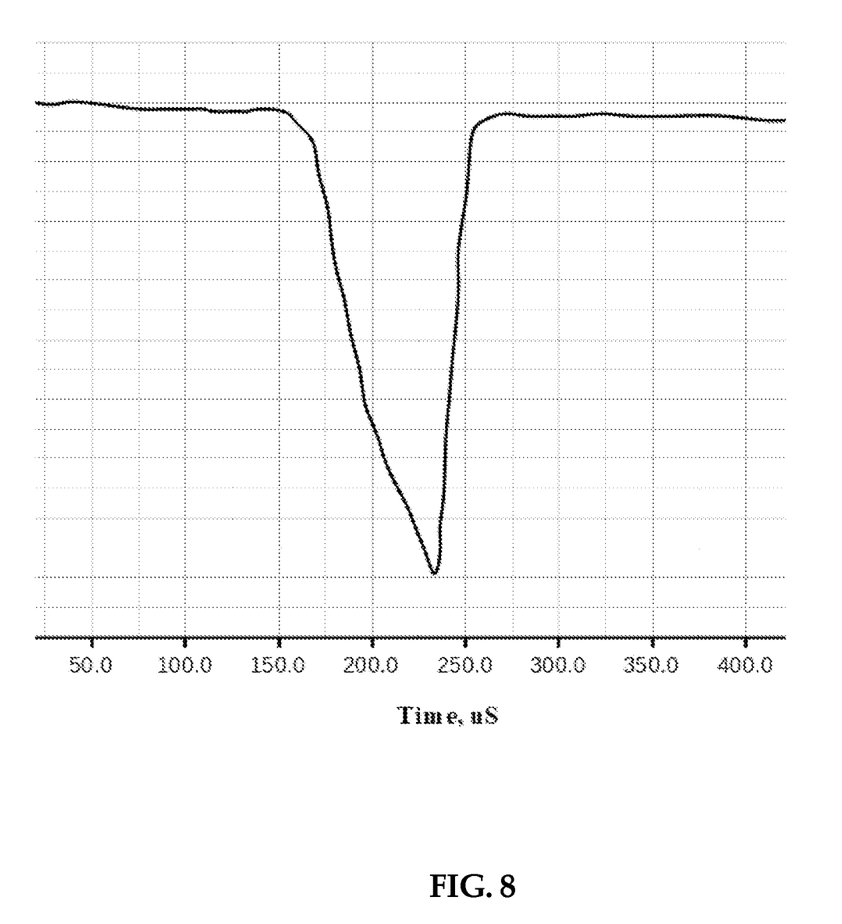
FIG. 8 is the pulse profile of the HiPIMS embodiment for deposition of Nb on a copper SRF single cell, showing pulse peak power at 387 kW for a 118 µs pulse.

With reference to FIG. 6 representing the embodiment for the pulsed electropolishing application, the solid-state switcher 38 is re-configured with the IGBTs 12 in series.

Figure 9:
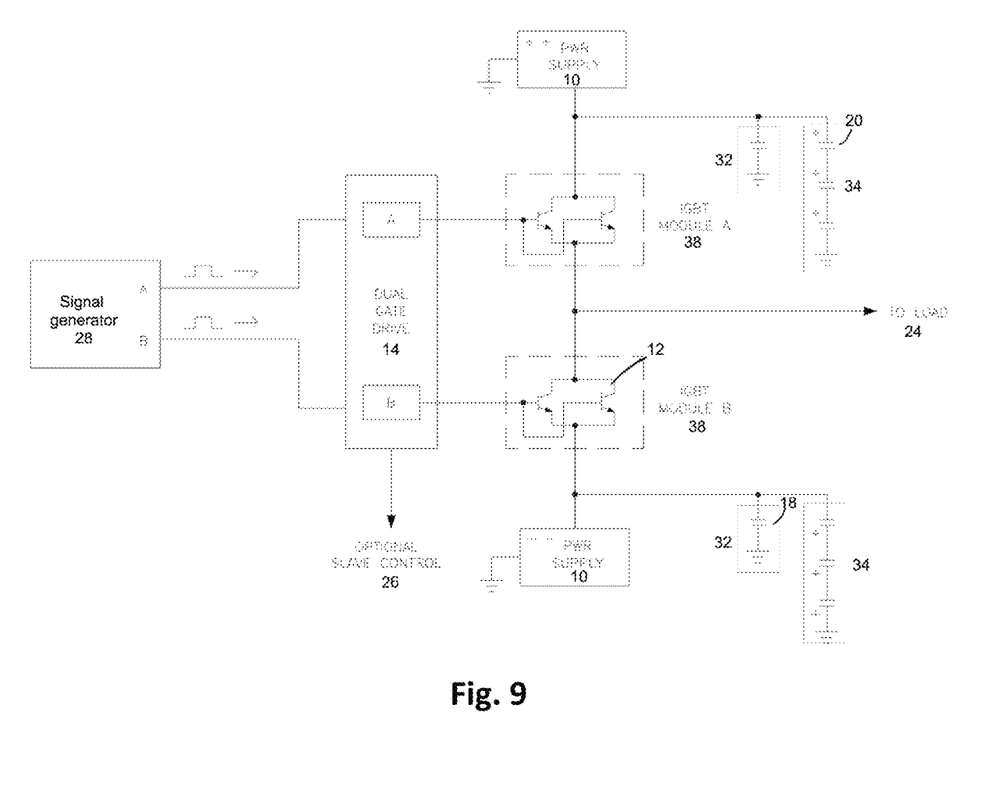
FIG. 9 is the diagram of an embodiment of the invention for MPPMS application and depicting a system of IGBTs allowing switchable polarity for use in unipolar and bipolar mode.

With reference to FIG. 9, the dual gate driver drives two or more solid-state switchers 38 composed of a combination of IGBTs 12 in series and in parallel. The solid state switchers 38 are driven simultaneously in a standalone or master/slave configuration while externally and optically isolated.

With reference to FIG. 6, the embodiment of the invention as a high current bi-polar pulse system includes two or more independently settable high current low voltage DC power supplies 10, two or more high capacity capacitor banks 34, an electrochemical cell 40 including a metal finishing work piece 36, such as a niobium RF accelerator cavity, a counter electrode 24, and an electrically conducting fluid, so-called electrolyte, 42 between the work piece 36 and the counter electrode 24. In this embodiment, preferably, the DC power supplies 10 provide 4-20 volts (V) and the very high capacity capacitor banks 34, here afforded by ultra-capacitor technology preferably provide 10 farads (F) or greater electrical capacitance. A solid-state switcher 38, preferably a fast switching, low impedance semi-conductor device 38, comprised with IGBTs 12 in series, provides a high current, preferably greater than 500 amps (A), conduction path from the capacitor banks 34 through the electrochemical cell 40. A pulse formation circuit 28 engages discharge of the capacitor banks 34 through the solid state switcher 38 and electrochemical cell 40 according to a selected programmed sequence. The embodiment of the invention in the high current bi-polar pulse system is a high isolation, high current switching device that provides independently controllable, alternating polarity, variable time duration pulses for electrochemical and mechanical finishing of metallic components in an electrically conducting fluid bath.

Figure 10:
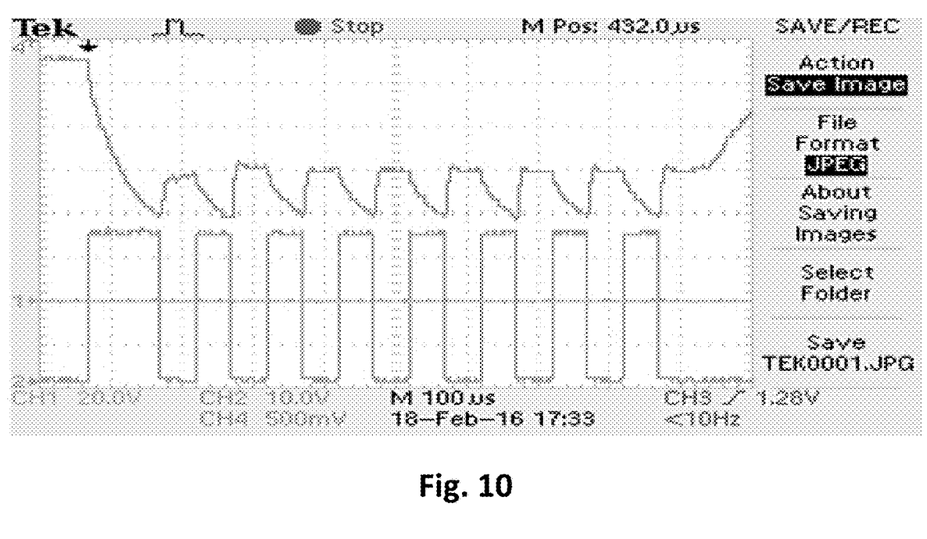
FIG. 10 is the MPPMS macropulse structure, created by leading 100 us pulse, closely followed by 50 us pulses having 50% duty factor. Each 650V micropulse represents about 125 A, resulting in 80 kW peak power. A 90 Hz macropulse repetition rate results in an average power of 300 W.

With reference to FIG. 9, the embodiment of the present invention in MPPMS configuration facilitates bi-polar high voltage with medium to high current micro and macro pulse structures for deposition. In this mode, the dual gate driver 14 is used to individually control multiple solid state switchers 38 to allow switchable polarity for use in unipolar and bipolar mode, produce more complex pulse structures, and create macro pulses made of a train of individually shaped bipolar micro pulses, as shown in FIG. 10.

Figure 11:
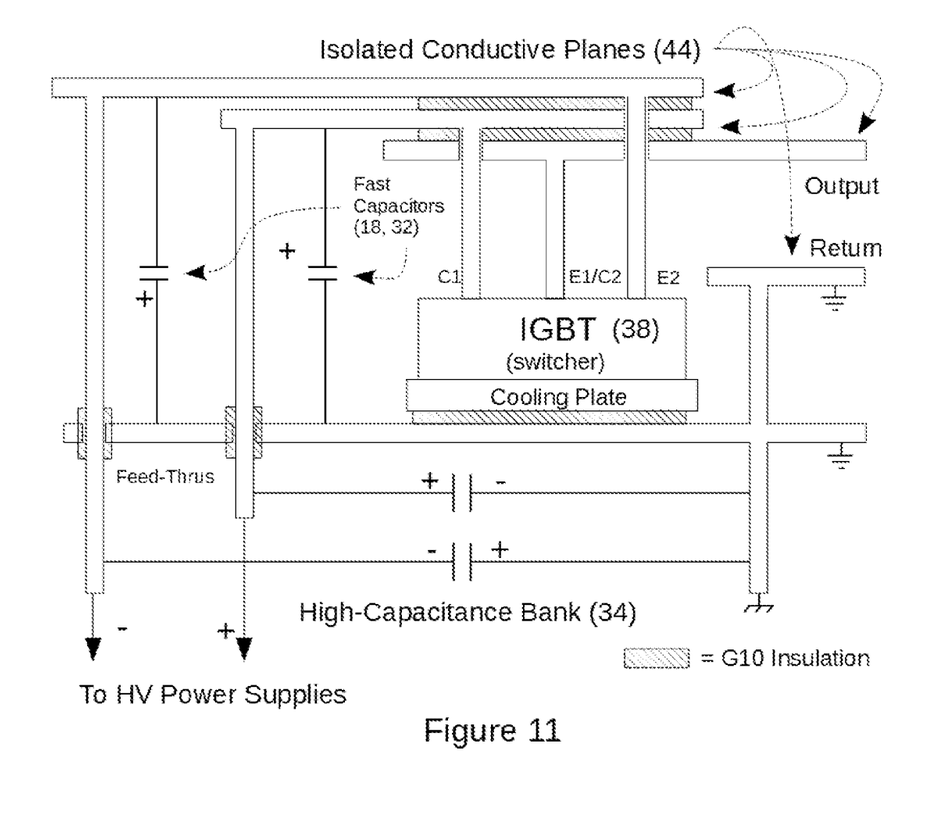
FIG. 11 is a picture of the isolated conducting planes connecting the IGBT(s), capacitor banks and electrical load.

With reference to FIG. 11, a series of isolated conducting planes 44 connecting the solid-state switcher 38 comprised of IGBTs, capacitor banks 32 and 34 and electrical load provide extremely low series impedance while providing local capacitance for fast pulse response.

Depending on the chosen process, the load to which the present invention is connected to is comprised of multiple electrically conducting surfaces, namely a cathode, a grid and an anode. The function of each of the multiple electrically conducting surfaces is interchangeable depending on the process, deposition, etching or electrochemistry.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments described herein were chosen and described in order to best explain the principles of the invention and the practical application, and to enable others of ordinary skill in the art to understand the invention for various embodiments while realizing that various modifications may be made to suit the particular use contemplated.

What is claimed is:

1. A pulsed surface processing system comprising:
a DC power supply;
electrodes, including an anode and a cathode;
a solid-state switcher including two or more insulated gate bipolar transistors (IGBT) to generate high power pulses;
a dual gate driver supplying power to the IGBT gates to drive the switches of the solid-state switcher simultaneously;
one or more capacitor banks;
a bias voltage source for supplying power to the anode; and
a pulse information circuit to control a pulse timing and a pulse duration to the electrodes.

2. The system of claim 1, comprising a freewheeling diode to protect the system from abrupt changes in current in a reactive load thereby protecting the pulser circuit from high voltage reflected pulses.

3. The system of claim 1, wherein said one or more capacitor banks include:
a first capacitor bank including one or more capacitors; and
a second capacitor bank including one or more capacitors.

4. The system of claim 3, comprising:
said one or more capacitors in said first capacitor bank are high frequency, fast response capacitors, each having a capacitance of 1.5 µF; and
said one or more capacitors in said second capacitor bank are high energy density capacitors each having a capacitance of 3300 µF.

5. The system of claim 1, comprising an anode-cathode configuration to drive surface processing techniques such as plasma generation, deposition, electrochemistry and others.

6. The system of claim 5 wherein an applied bias voltage can be supplied internally, externally and controlled by the main supply driver.

7. The system of claim 1, wherein said pulses comprise a pulse frequency range only limited by the IGBT used, from DC to about 1 MHz.

8. The system of claim 1, wherein said pulsed surface processing system comprises an adjustable pulse duration of 1 µs to an upper duration limited by the DC power supply.

9. The system of claim 8, comprising:
the pulse duration includes a lower limit of 1 µs; and
an upper pulse duration determined by the equation $$t\text{pulse} \times f\text{rep} \times P\text{pulse} <= P\text{avg, wherein} \qquad 1)$$

tpulse is the width of the pulse;
frep is the pulse repetition frequency;
Ppulse is the peak pulse power; and
Pavg is the average power rating of the DC power supply.

10. The system of claim 1, wherein said pulses comprise:
a current maximum of 2000 amps; and
the current is regulated within 50 amps of target.

11. The system of claim 1, wherein said pulses comprise:
a voltage maximum of 2000 volts; and
the voltage is regulated within 2 volts of target.

12. The system of claim 1, comprising said IGBT gates of said solid-state switcher are configured in parallel.

13. The system of claim 1, comprising said IGBT gates of said solid-state switcher are configured in series.

14. The system of claim 1, comprising said high power pulses are in unipolar mode.

15. The system of claim 1, comprising said high power pulses are in bipolar mode.

16. The system of claim 1, comprising:
said gate driver drives the switches of the solid-state switcher in a standalone configuration; and said switches of the solid-state switcher are externally and optically isolated.

17. The system of claim 1, comprising:
one or more electrically conducting planes configured to produce an arc for processing the surface of a material; and
one or more isolated conducting planes connecting the IGBT gates, the capacitor banks, and an electrical load.

18. The system of claim 1, comprising said capacitors are high frequency capacitors mounted close to the switch to provide low impedance, fast response to load changes, and quick snubbing to prevent transient pulse phenomena.

19. The system of claim 1, comprising said bias voltage source supplies power to the electrodes.

20. The system of claim 19, comprising:
said system is configurable in a plurality of modes; and
said modes include slaved to the master pulse, a stand-alone pulsed electrical bias, slave to master gate, and slave to an independent time reference.

* * * * *